(12) United States Patent
Ding et al.

(10) Patent No.: US 11,085,817 B2
(45) Date of Patent: Aug. 10, 2021

(54) DEVICE AND METHOD FOR DETECTING LIGHT INTENSITY, AND DISPLAY DEVICE

(71) Applicant: BOE TECHNOLOGY GROUP CO., LTD., Beijing (CN)

(72) Inventors: Xiaoliang Ding, Beijing (CN); Haisheng Wang, Beijing (CN); Yingming Liu, Beijing (CN); Xueyou Cao, Beijing (CN); Yanling Han, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 137 days.

(21) Appl. No.: 16/341,498

(22) PCT Filed: Jul. 2, 2018

(86) PCT No.: PCT/CN2018/094000
§ 371 (c)(1),
(2) Date: Apr. 12, 2019

(87) PCT Pub. No.: WO2019/033863
PCT Pub. Date: Feb. 21, 2019

(65) Prior Publication Data
US 2019/0250031 A1 Aug. 15, 2019
US 2020/0271513 A9 Aug. 27, 2020

(30) Foreign Application Priority Data

Aug. 14, 2017 (CN) .......................... 201710695499.6

(51) Int. Cl.
*G01J 1/46* (2006.01)
*G09G 5/10* (2006.01)
(Continued)

(52) U.S. Cl.
CPC . *G01J 1/46* (2013.01); *G01J 1/42* (2013.01); *G09G 5/10* (2013.01);
(Continued)

(58) Field of Classification Search
CPC ...... G09G 3/3233; G09G 3/3258; G09G 3/36; G09G 5/10; G09G 2360/144;
(Continued)

(56) References Cited

U.S. PATENT DOCUMENTS 5,198,660 A * 3/1993 Yokoyama ................ G01J 1/46
250/214 A
2007/0090276 A1* 4/2007 Peng ...................... G01J 1/1626
250/214.1

(Continued)

FOREIGN PATENT DOCUMENTS

CN 1689316 A 10/2005
CN 1945240 A 4/2007

(Continued)

OTHER PUBLICATIONS

PCT International Search Report, Application No. PCT/CN2018/094000, dated Oct. 8, 2018, 6 pages: with English translation.

(Continued)

*Primary Examiner* — Thanh Luu
*Assistant Examiner* — Monica T Taba
(74) *Attorney, Agent, or Firm* — Armstrong Teasdale LLP

(57) ABSTRACT

Embodiments of the present disclosure provide a device and a method for detecting a light intensity. The device includes a photosensor, an input circuit, an amplification circuit, a feedback circuit, a storage circuit, and an output circuit. The photosensor is coupled to a first voltage signal terminal and a first node. The input circuit provides a first voltage signal to the first node according to an input signal. The amplification circuit provides, to a second node, a second voltage (Continued)

signal from a second voltage signal terminal according to the voltage of the first node. The feedback circuit couples the first node to the second node according to a reset signal. The storage circuit stores a voltage difference between the first node and the second node. The output circuit reads the voltage of the second node according to a read signal.

19 Claims, 7 Drawing Sheets

(51) Int. Cl.
*H03K 17/687* (2006.01)
*G01J 1/42* (2006.01)
*G01J 1/44* (2006.01)
*G06K 9/00* (2006.01)

(52) U.S. Cl.
CPC ...... *G01J 2001/446* (2013.01); *G06K 9/0004* (2013.01); *G06K 9/00013* (2013.01); *G09G 2360/144* (2013.01); *H03K 17/6871* (2013.01)

(58) Field of Classification Search
CPC .......... G01J 2001/446; G01J 1/16; G01J 1/44; G01J 1/4204; G03B 7/083; H04N 5/2253; H01J 40/00; H01J 40/14; H03K 17/00
See application file for complete search history.

(56) References Cited

U.S. PATENT DOCUMENTS

| | | | |
|---|---|---|---|
| 2012/0025063 A1* | 2/2012 | Woodbury | H03F 3/087 250/214 A |
| 2012/0086095 A1* | 4/2012 | Nishiyama | H04N 5/369 257/432 |
| 2016/0028984 A1* | 1/2016 | Ganguly | H04N 5/35509 348/313 |
| 2017/0142352 A1* | 5/2017 | Pang | H04N 5/35536 |
| 2020/0076377 A1* | 3/2020 | Yoshikawa | H03F 3/68 |

FOREIGN PATENT DOCUMENTS

| | | |
|---|---|---|
| CN | 101320138 A | 12/2008 |
| CN | 104112426 A | 10/2014 |
| CN | 106898636 A | 6/2017 |
| CN | 107314813 A | 11/2017 |
| JP | 2004191244 A | 7/2004 |
| JP | 2010271246 A | 12/2010 |
| WO | 2008022474 A1 | 2/2008 |

OTHER PUBLICATIONS

PCT Written Opinion, Application No. PCT/CN2018/094000, dated Oct. 8, 2018, 6 pages.: with English translation of relevant part.
China First Office Action, Application No. 201710695499.6, dated Apr. 4, 2018, 8 pps. with English translation.

* cited by examiner

DEVICE AND METHOD FOR DETECTING LIGHT INTENSITY, AND DISPLAY DEVICE

CROSS REFERENCE TO RELATED APPLICATIONS

This patent application is a National Stage Entry of PCT/CN2018/094000 filed on Jul. 2, 2018, which claims the benefit and priority of Chinese Patent Application No. 201710695499.6 filed on Aug. 14, 2017, the disclosures of which are incorporated by reference herein in their entirety as part of the present application.

BACKGROUND

Embodiments of the present disclosure relate to the field of display technologies, and more particularly, to a device and a method for detecting a light intensity, and a display device.

With the development of display technologies, display effects of display devices become more and more better, providing users with good visual experiences. Due to the improvement of living standards, users' requirements for the display devices are not limited to the display effects, but also require diverse functions of the display devices. For example, according to an intensity of ambient light, brightness of a display screen can be adjusted, and a biological recognition can also be performed.

BRIEF DESCRIPTION

Embodiments of the present disclosure provide a device for detecting a light intensity, a method for detecting a light intensity, and a display device.

A first aspect of the present disclosure provides a device for detecting a light intensity. The device for detecting a light intensity includes a photosensor, an input circuit, an amplification circuit, a feedback circuit, a storage circuit, and an output circuit. The photosensor may be coupled to a first voltage signal terminal and a first node. The input circuit may be configured to provide, to the first node, a first voltage signal from the first voltage signal terminal under control of an input signal from a signal input terminal, to control a voltage of the first node. The amplification circuit may provide, to a second node, a second voltage signal from a second voltage signal terminal under the control of the voltage of the first node, to control a voltage of the second node. The feedback circuit may couple the first node to the second node under control of a reset signal from a signal reset terminal. The storage circuit may store a voltage difference between the first node and the second node, to control the voltage of the first node and the voltage of the second node. The output circuit may read the voltage of the second node under control of a read signal from a read control terminal.

In some embodiments of the present disclosure, the amplification circuit may include a first transistor and a second transistor. A control electrode and a first electrode of the first transistor are coupled to the first voltage signal terminal, and a second electrode of the first transistor is coupled to the second node. A control electrode of the second transistor is coupled to the first node, a first electrode of the second transistor is coupled to the second node, and a second electrode of the second transistor is coupled to the second voltage signal terminal.

In some embodiments of the present disclosure, the input circuit may include a third transistor. A control electrode of the third transistor is coupled to the signal input terminal, a first electrode of the third transistor is coupled to the first node, and a second electrode of the third transistor is coupled to the first voltage signal terminal.

In the embodiments of the present disclosure, the feedback circuit may include a fourth transistor. A control electrode of the fourth transistor is coupled to the signal reset terminal, a first electrode of the fourth transistor is coupled to the first node, and a second electrode of the fourth transistor is coupled to the second node.

In some embodiments of the present disclosure, the storage circuit may include a capacitor. An end of the capacitor is coupled to the first node, and another end of the capacitor is coupled to the second node.

In some embodiments of the present disclosure, the output circuit may include a fifth transistor. A control electrode of the fifth transistor is coupled to the read control terminal, a first electrode of the fifth transistor is coupled to the second node, and a second electrode of the fifth transistor is coupled to an output line.

In some embodiments of the present disclosure, the photosensor may include a photosensitive diode.

In some embodiments of the present disclosure, a size of the first transistor is equal to a size of the second transistor.

A second aspect of the present disclosure provides a device for detecting a light intensity. The device may include a photosensitive diode, a first transistor, a second transistor, a third transistor, a fourth transistor, a capacitor, and a fifth transistor. The photosensitive diode is coupled to a first voltage signal terminal and a first node. A control electrode and a first electrode of the first transistor are coupled to the first voltage signal terminal, and a second electrode of the first transistor is coupled to the second node. A control electrode of the second transistor is coupled to the first node, a first electrode of the second transistor is coupled to the second node, and a second electrode of the second transistor is coupled to the second voltage signal terminal. A control electrode of the third transistor is coupled to the signal input terminal, a first electrode of the third transistor is coupled to the first node, and a second electrode of the third transistor is coupled to the first voltage signal terminal. A control electrode of the fourth transistor is coupled to the signal reset terminal, a first electrode of the fourth transistor is coupled to the first node, and a second electrode of the fourth transistor is coupled to the second node. An end of the capacitor is coupled to the first node, and another end of the capacitor is coupled to the second node. A control electrode of the fifth transistor is coupled to the read control terminal, a first electrode of the fifth transistor is coupled to the second node, and a second electrode of the fifth transistor is coupled to an output line.

In some embodiments of the present disclosure, the first transistor, the second transistor, the third transistor, the fourth transistor, and the fifth transistor are N-type transistors.

A third aspect of the present disclosure also provides a method for detecting a light intensity. The method includes providing a first voltage signal from a first voltage signal terminal to a first node under control of an input signal, such that a photosensor has an equal voltage at two ends of the photosensor, and coupling the first node to a second node under control of a reset signal from a signal reset terminal, such that a voltage of the first node is equal to a voltage of the second node, controlling the voltage of the first node to remain unchanged in the case that the photosensor generates a photocurrent under irradiation of light, such that a voltage difference across the photosensor remains unchanged and charging a storage circuit by the photocurrent to control the voltage of the second node, and reading the voltage of the second node under control of a read signal from a read control terminal.

In some embodiments of the present disclosure, controlling the voltage of the first node to remain unchanged includes controlling the voltage of the second node according to the voltage of the first node, and controlling the voltage of the first node to remain unchanged via the storage circuit.

In some embodiments of the present disclosure, the read voltage of the second node is $V_{out}=V_{dd}+I_{data}*t$. The $V_{dd}$ represents a voltage of the first voltage signal terminal, the $I_{data}$ represents a current value of the photocurrent, and the t represents time when the photosensor is under the irradiation of the light.

A fourth aspect of the present disclosure also provides a display device. The display device includes scanning lines and data lines intersected with each other and a pixel region defined by the scanning lines and the data lines. The display device also includes the device for detecting a light intensity in the pixel region according to the first aspect or the second aspect of the present disclosure.

In some embodiments of the present disclosure, the device for detecting a light intensity is arranged in an array form, and the device for detecting a light intensity in the same row or the same column is coupled to the same output line.

BRIEF DESCRIPTION OF THE DRAWINGS

To describe the technical solutions of the present disclosure more clearly, the accompanying drawings of the embodiments will be briefly introduced below. It is to be known that the accompanying drawings in the following description merely involve with some embodiments of the present disclosure, but not limit the present disclosure, wherein the same reference numerals indicate the same elements or signals. In the drawings.

DETAILED DESCRIPTION

Detailed description of embodiments of the present disclosure will be made below with reference to the accompanying drawings to make the technical solutions and advantages of the present disclosure more apparent. It is to be noted that the embodiments of this application and the features in the embodiments may be arbitrarily combined with each other in the case of no conflict.

For clarity, in the accompanying drawings for describing the embodiments of the present disclosure, thicknesses and sizes of layers or microstructures are amplified. It is to be understood that when an element such as layer, film, region, or substrate is referred to as being positioned "on" or "below" another element, the element may be "directly" positioned "on" or "below" the other element, or an intermediate element may be present.

In the description of the present disclosure, unless otherwise stated, the term "a plurality of" means two or more than two, and the orientation or position relations represented by the terms of "above", "beneath", "left", "right", "inside", "outside" and the like are orientation or position relations shown based on the accompanying figures, they are merely for ease of a description of the present disclosure and a simplified description instead of being intended to indicate or imply the device or element to have a special orientation or to be configured and operated in a special orientation. Thus, they cannot be understood as limiting of the present disclosure.

In the description of the present disclosure, it is to be noted that unless explicitly specified or limited otherwise, terms "installation", "connecting" or "coupling" should be understood in a broad sense, which may be, for example, a fixed connection, a detachable connection or integrated connection, a mechanical connection or an electrical connection, or a direct connection or indirect connection by means of an intermediary. For those of ordinary skill in the art, specific meanings of the above terms in the present disclosure may be understood based on specific circumstances.

Those skilled in the art may appreciate that all the transistors used in all the embodiments of the present application may be thin-film transistors or field effect transistors or other devices having the same characteristics. For example, the thin-film transistors used in the embodiments of the present disclosure may be oxide semiconductor transistors. In some embodiments of the present disclosure, a gate of the transistor may be referred to as a control electrode. A source and a drain of the transistor are symmetrical, and thus the source and the drain are not distinguished. That is, the source of the transistor may be a first electrode (or a second electrode), whereas the drain of the transistor may be the second electrode (or the first electrode).

Figure 1:
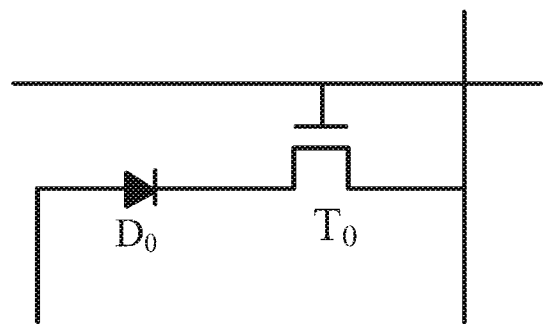
FIG. 1 illustrates a schematic structural diagram of an exemplary fingerprint sensor.

Generally, it is required to perform a light intensity detection using a photosensor, to implement adjusting of the brightness of a display screen according to the intensity of ambient light. That is, the intensity of the ambient light can be determined by detecting an amplitude of a photocurrent signal generated under light irradiation. Generally, in the process of biological recognition, a fingerprint recognition circuit may be employed, which is, for example, composed of a plurality of fingerprint sensors. FIG. 1 illustrates a schematic structural diagram of an exemplary fingerprint sensor. As shown in FIG. 1, the fingerprint sensor includes a photosensor D0 and a switching transistor T0. When light is irradiated onto a finger, different reflected lights may be generated at different locations due to a difference between fingerprint valleys and fingerprint ridges. The light intensities of the photosensors D0 in a plurality of fingerprint sensors may be different, and thus different photocurrent signals may be generated. The light intensity may be determined by detecting the photocurrent signal generated in the photosensor D0. Then, under the control of the switching transistor T0, the photocurrent signal generated by the photosensor D0 can be read to implement the detection of the fingerprint valleys and fingerprint ridges.

When the light intensity is detected, the photosensor is typically in a bias state. However, even in the absence of light irradiation, there may be a dark current in the photosensor in the bias state. The dark current increases the noise in the photosensor, thereby having a negative effect on the accuracy of the light intensity detection.

Figure 2:
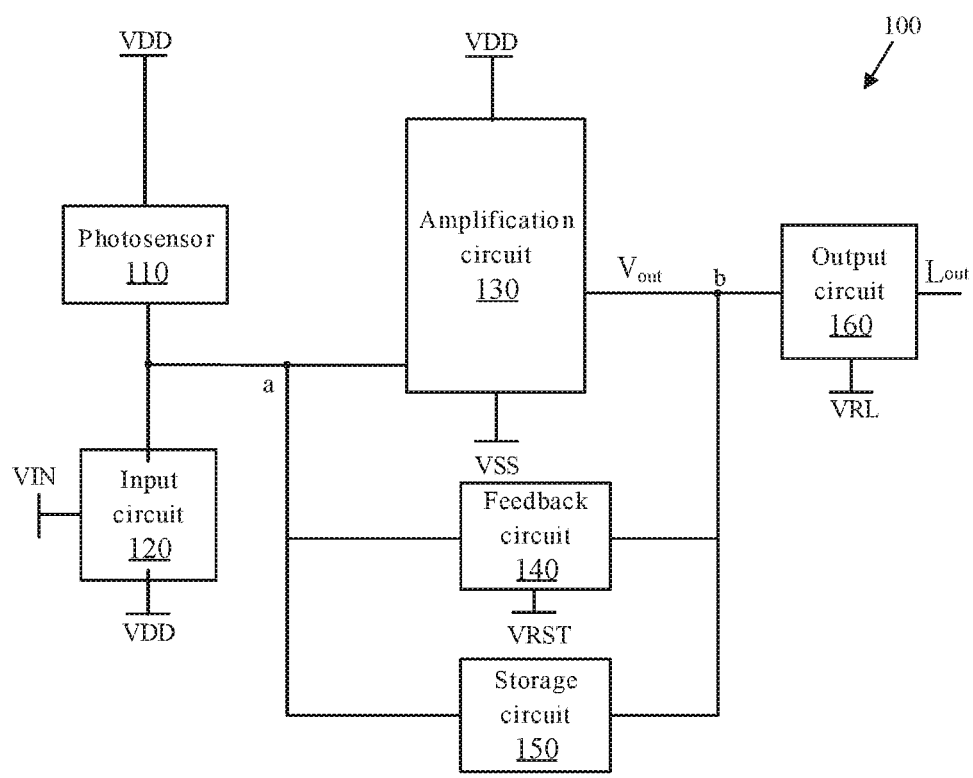
FIG. 2 illustrates a schematic structural diagram of a device for detecting a light intensity according to an embodiment of the present disclosure.

FIG. 2 illustrates a schematic structural diagram of a device for detecting a light intensity (hereinafter referred to as a light intensity detecting device) according to an embodiment of the present disclosure. As shown in FIG. 2, the light intensity detecting device 100 may include a photosensor 110, an input circuit 120, an amplification circuit 130, a feedback circuit 140, a storage circuit 150, and an output circuit 160.

In some embodiments of the present disclosure, the photosensor 110 may be coupled to a first voltage signal terminal VDD and a first node a. The photosensor 110 may sense an optical signal and convert the sensed optical signal into a photocurrent. In some embodiments, the photosensor 110 may be a photosensitive diode.

The input circuit 120 may be coupled to a signal input terminal VIN, the first voltage signal terminal VDD, and the first node a. The input circuit 120 may provide, to the first node a, a first voltage signal from the first voltage signal terminal VDD under the control of an input signal from the signal input terminal VIN, to control a voltage of the first node a.

The amplification circuit 130 may be coupled to the first voltage signal terminal VDD, a second voltage signal terminal VSS, the first node a, and a second node b. The amplification circuit 130 may provide a second voltage signal from the second voltage signal terminal VSS to the second node b under the control of the voltage of the first node a, to control the voltage of the second node b.

The feedback circuit 140 may be coupled to a signal reset terminal VRST, the first node a, and the second node b. The feedback circuit 140 may couple the first node a to the second node b under the control of a reset signal from the signal reset terminal VRST, such that the voltage of the first node a can be equal to the voltage of the second node b.

The storage circuit 150 may be coupled between the first node a and the second node b. The storage circuit 150 may store a voltage difference between the first node a and the second node b to control the voltage of the first node a and the voltage of the second node b.

The output circuit 160 may be coupled to the second node b and a read control terminal VRL. The output circuit 160 may read the voltage of the second node b under the control of a read signal from the read control terminal VRL. In an embodiment, the output circuit 160 also may be coupled to an output line $L_{out}$ to output the voltage of the second node b to the output line according to the read signal.

In some embodiments of the present disclosure, a first voltage signal from the first voltage signal terminal VDD is a high level signal Vdd, and a second voltage signal from the second voltage signal terminal VSS is a low level signal Vss.

In some embodiments, when the photosensor 110 is not irradiated by light, an end of the photosensor 110 is always coupled to the first voltage signal terminal VDD, and the voltage of the photosensor 110 is always held at Vdd. The other end of the photosensor 110 is coupled to the first node a, and the voltage of the first node a is controlled by the input circuit 120 to be the voltage Vdd of the first voltage signal from the first voltage signal terminal VDD. In this manner, the photosensor 110 has an equal voltage at both ends, i.e., the photosensor 110 is in a zero bias state. In addition, when the photosensor 110 is irradiated by light, the photocurrent generated by the photosensor 110 may cause a slight rise of the voltage of the first node a. Under the control of the amplification circuit 130, the voltage of the second node b drops sharply. The voltage of the first node a is controlled back to Vdd by the feedback circuit 140, and the voltage of the second node b is adjusted. However, all these phenomena are instantaneous. That is, the voltage of the first node a is not changed and is always held at Vdd. Therefore, in the process of photoelectric conversion of the photosensor 110, the voltage difference across the photosensor 110 always remains the same, that is, the photosensor 110 is in a zero bias state. Therefore, there is no dark current in the photosensor.

According to some embodiments of the present disclosure, in the light intensity detecting device, the voltage difference across the photosensor always remains the same in the process of photoelectric conversion of the photosensor, and thus it is ensured that the photosensor is in the zero bias state. Therefore, the dark current in the photosensor can be eliminated, and thus noise generated by the dark current can be avoided, and accuracy of light intensity detection can be improved.

The circuit structure of the light intensity detecting device 100 is described in detail below by an exemplary embodiment.

Figure 3:
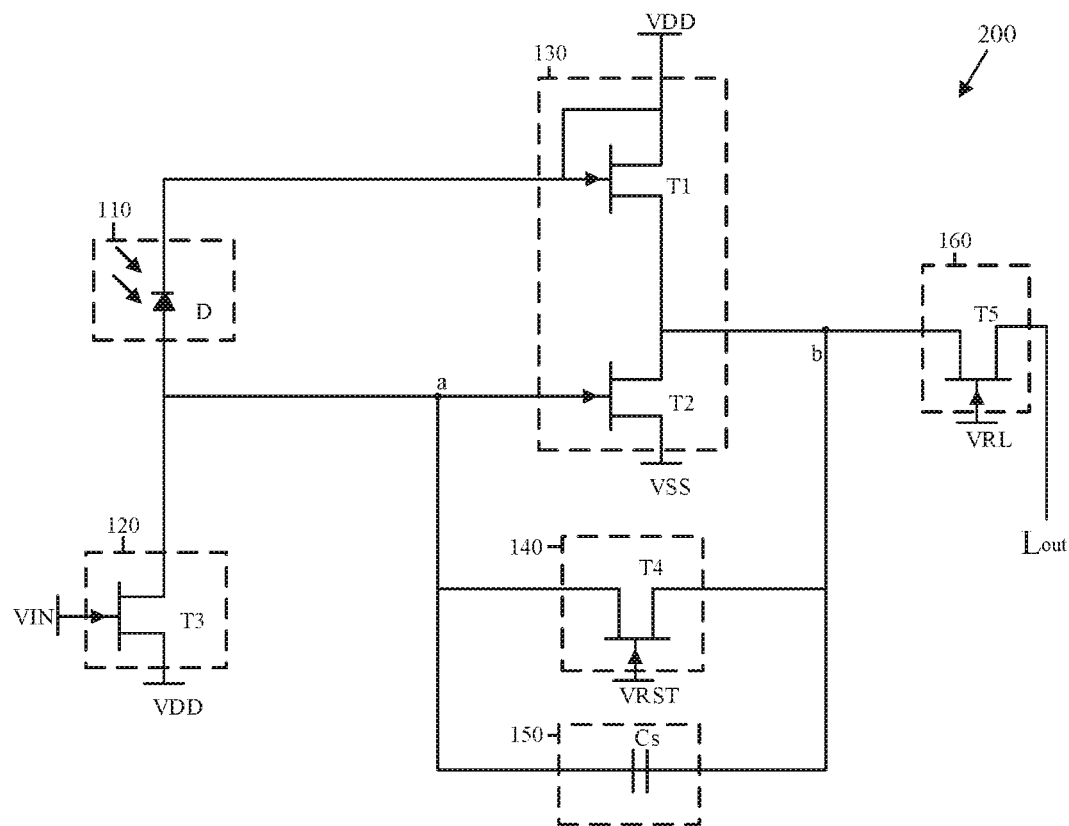
FIG. 3 illustrates an exemplary circuit diagram of a device for detecting a light intensity according to an embodiment of the present disclosure.

FIG. 3 illustrates an exemplary circuit diagram of a light intensity detecting device 200 according to an embodiment of the present disclosure. The light intensity detecting device 200 may be, for example, the light intensity detecting device 100 as shown in FIG. 2. In an embodiment, the transistors used may be N-type transistors or P-type transistors, for example, N-type or P-type metal-oxide-semiconductor field effect transistors (MOSFET). In some embodiments of the present disclosure, a gate of the transistor is referred to as a control electrode. A source and a drain of the transistor are symmetrical, and thus the source and the drain are not distinguished. That is, the source of the transistor may be a first electrode (or a second electrode), and the drain of the transistor may be the second electrode (or the first electrode).

In some embodiments of the present disclosure, a detailed description is made by taking an N-type metal oxide semiconductor (NMOS) field effect transistor as an example.

As shown in FIG. 3, the photosensor 110 may be a photosensitive diode D.

The input circuit 120 may include a third transistor T3. A control electrode of the third transistor T3 is coupled to the signal input terminal VIN, a first electrode of the third transistor T3 is coupled to the first node a, and a second electrode of the third transistor T3 is coupled to the first voltage signal terminal VDD.

The amplification circuit 130 may include a first transistor T1 and a second transistor T2. A control electrode and a first electrode of the first transistor T1 are coupled to the first voltage signal terminal VDD, and a second electrode of the first transistor T1 is coupled to the second node b. A control electrode of the second transistor T2 is coupled to the first node a, a first electrode of the second transistor T2 is coupled to the second node b, and a second electrode of the second transistor T2 is coupled to the second voltage signal terminal VSS.

The feedback circuit 140 may include a fourth transistor T4. A control electrode of the fourth transistor T4 is coupled to the signal reset terminal VRST, a first electrode of the fourth transistor T4 is coupled to the first node a, and a second electrode of the fourth transistor T4 is coupled to the second node b.

The storage circuit 150 may include a capacitor Cs. An end of the capacitor Cs is coupled to the first node a, and another end of the capacitor Cs is coupled to the second node b. In some embodiments of the present disclosure, the capacitor Cs may be either a liquid crystal capacitor composed of a pixel electrode and a common electrode, or an equivalent capacitor composed of a storage capacitor and a liquid crystal capacitor composed of a pixel electrode and a common electrode, which is not limited in the present disclosure.

The output circuit 160 may include a fifth transistor T5. A control electrode of the fifth transistor T5 is coupled to the read control terminal VRL, a first electrode of the fifth transistor T5 is coupled to the second node b, and a second electrode of the fifth transistor T5 is coupled to the output line $L_{out}$.

Circuit structures of the photosensor 110, the input circuit 120, the amplification circuit 130, the feedback circuit 140, the storage circuit 150, and the output circuit 160 are described merely by way of example. Those skilled in the art may easily understand that the implementation manners of the above parts are not limited thereto, as long as respective functions thereof can be implemented.

Figure 4:
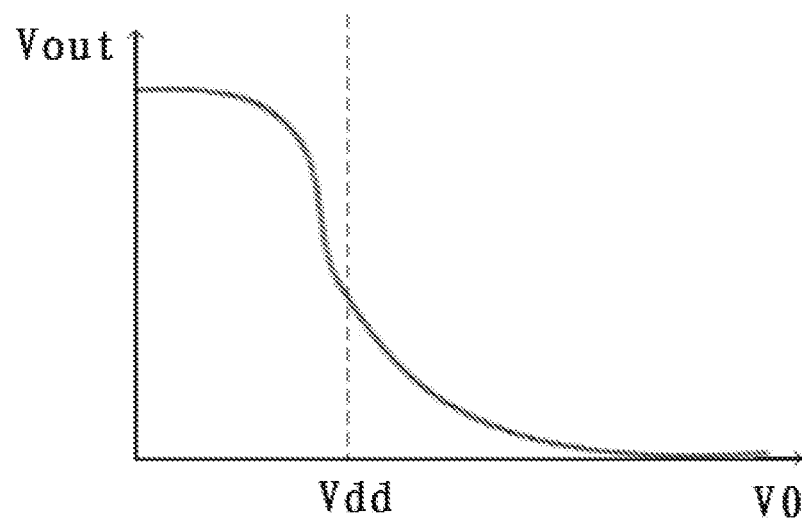
FIG. 4 illustrates a schematic diagram of an input voltage and an output voltage of an amplification circuit according to an embodiment of the present disclosure.

FIG. 4 illustrates a schematic diagram of a relationship between an input voltage and an output voltage of an amplification circuit in a light intensity detecting device according to an embodiment of the present disclosure. As shown in FIG. 4, as the input voltage of the amplification circuit increases, the output voltage reduces. In this embodiment, the input voltage of the amplification circuit 130 is the voltage V0 of the first node a, and the output voltage of the amplification circuit 130 is the voltage Vout of the second node b. Therefore, the voltage V0 of the first node is inversely proportional to the voltage Vout of the second node. As shown in FIG. 4, in the case that the voltage V0 of the first node a is in a region where a slope of curve is the largest (that is, a region near the voltage Vdd), the voltage Vout of the second node b may sharply drop when the voltage V0 of the first node a slightly increases. Those skilled in the art may understand that the amplification circuit in this embodiment functions as an inverter.

In some embodiments of the present disclosure, the first transistor T1 and the second transistor T2 may be equal in size. For example, a width-to-length ratio of the first transistor T1 is equal to a width-to-length ratio of the second transistor T2. Furthermore, a threshold voltage Vth1 of the first transistor T1 may be equal to a threshold voltage Vth2 of the second transistor T2, i.e., Vth1=Vth2. In an embodiment, the voltage Vdd of a signal from the first voltage signal terminal VDD may be greater than the threshold voltage Vth1 of the first transistor T1 and the threshold voltage Vth2 of the second transistor T2.

In some embodiments of the present disclosure, the first transistor T1, the second transistor T2, the third transistor T3, the fourth transistor T4, and the fifth transistor T5 are N-type thin-film transistors. In this way, process flows may be unified, and manufacturing processes may be reduced, thereby facilitating improvement of product yield. Embodiments of the present disclosure may use a low temperature polysilicon thin-film transistor because of its smaller leakage current. The thin-film transistor specifically may be selected from a thin-film transistor having a bottom gate structure or a thin-film transistor having a top gate structure, as long as a switching function can be implemented.

The working process of the light intensity detecting device is described below to further illustrate technical scheme of the embodiments of the present disclosure.

Figure 5:
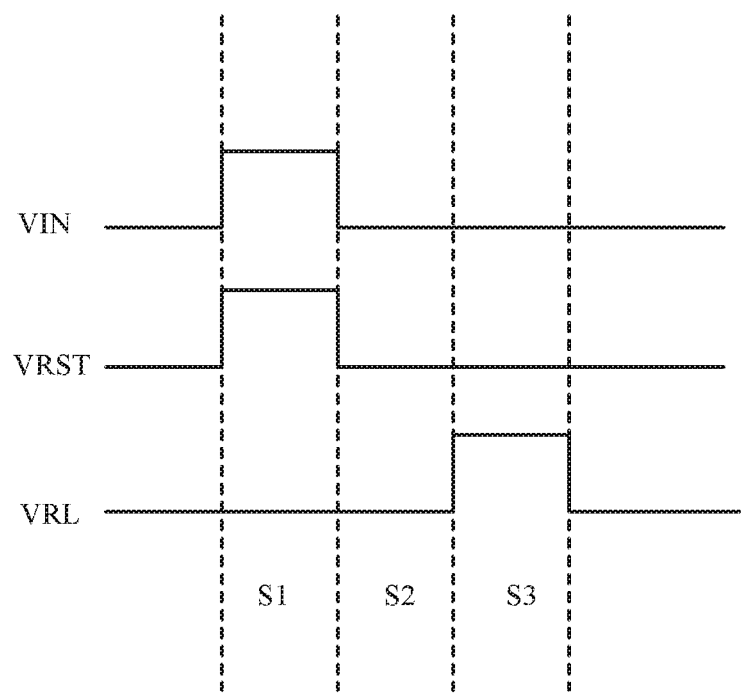
FIG. 5 illustrates a schematic timing diagram of a signal from a device for detecting a light intensity according to an embodiment of the present disclosure.

FIG. 5 illustrates a timing diagram of signals from a light intensity detecting device according to an embodiment of the present disclosure. The light intensity detecting device may be, for example, the light intensity detecting device 200 as shown in FIG. 3, which includes transistors (T1~T5), a photosensitive diode (D), a capacitor (Cs), and signal terminals (VIN, VRST, VDD, VSS, and VRL).

Figure 6A:
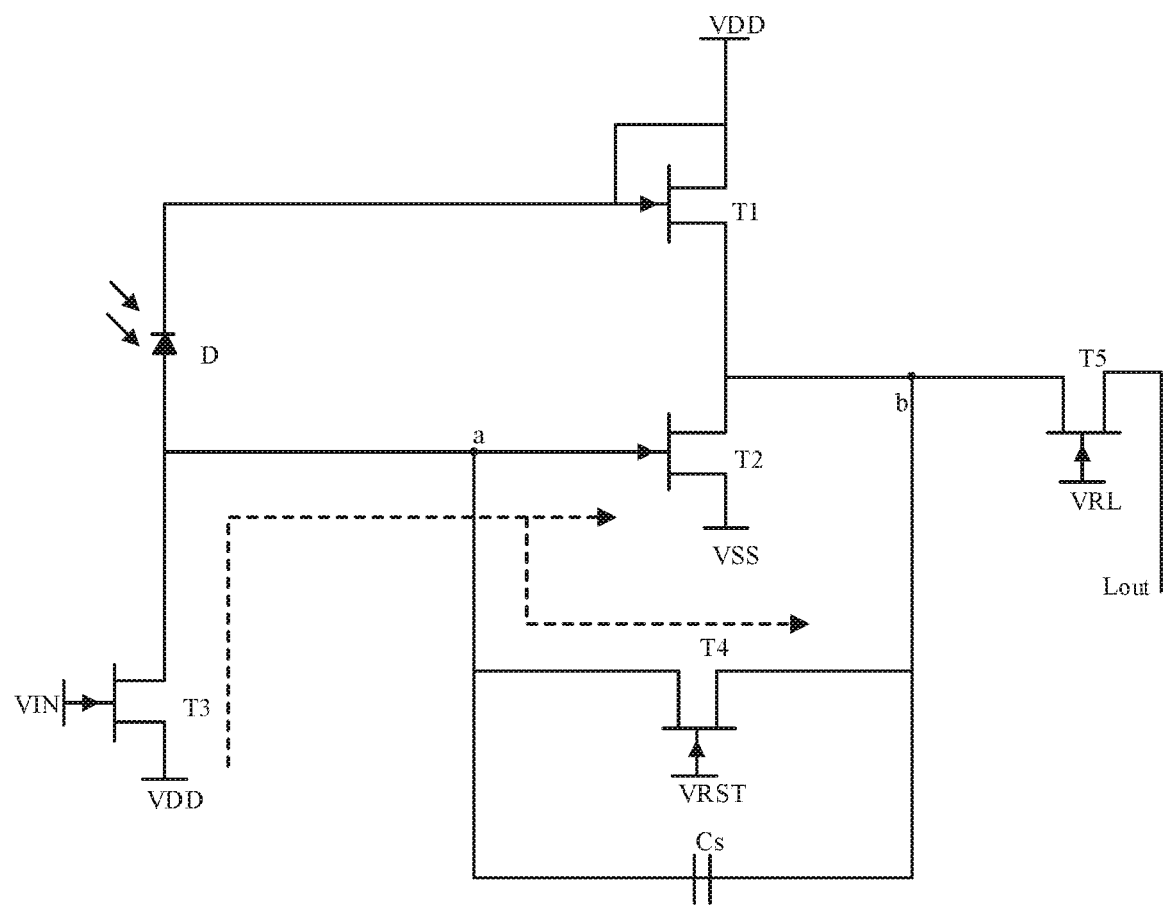
FIG. 6A illustrates a diagram illustrating working state of a device for detecting a light intensity in a first phase according to an embodiment of the present disclosure.
Figure 6B:
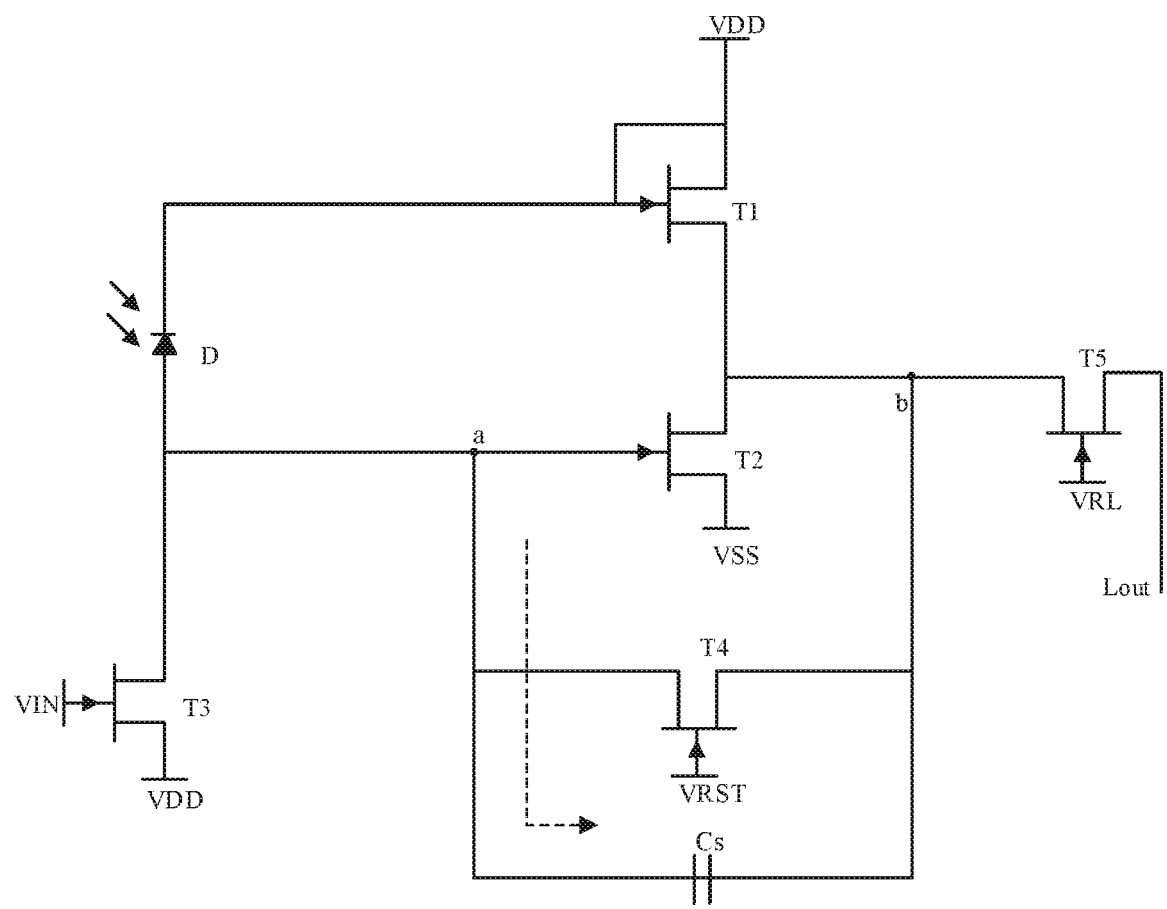
FIG. 6B illustrates a diagram illustrating working state of the device for detecting a light intensity in a second phase according to an embodiment of the present disclosure.
Figure 6C:
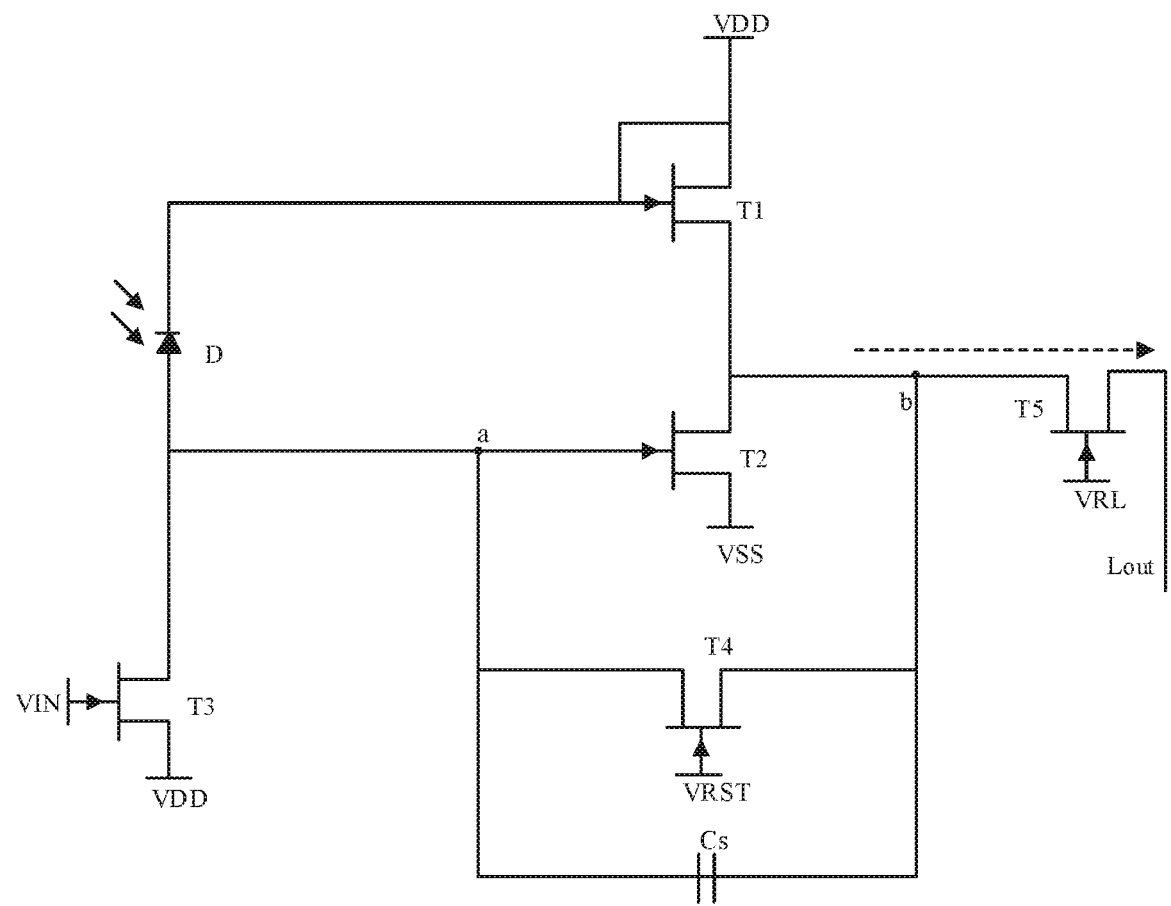
FIG. 6C illustrates a diagram illustrating working state of the device for detecting a light intensity in a third phase according to an embodiment of the present disclosure.

As shown in FIG. 5, the working process of the light intensity detecting device 200 may include, for example, a first phase S1, a second phase S2, and a third phase S3, which are described in detail below with reference to FIG. 6A to FIG. 6C. FIG. 6A illustrates a schematic working state diagram of the light intensity detecting device in the first phase S1 according to an embodiment of the present disclosure. FIG. 6B illustrates a schematic working state diagram of the light intensity detecting device in the second phase S2 according to an embodiment of the present disclosure. FIG. 6C illustrates a schematic working state diagram of the light intensity detecting device in the third phase S3 according to an embodiment of the present disclosure.

In the first phase S1, i.e., in a reset phase, both the input signal from the signal input terminal VIN and the reset signal from the signal reset terminal VRST are high level signals, and the read signal from the read control terminal VRL is a low level signal.

As shown in FIG. 6A, the third transistor T3 is turned on and provides the first voltage signal from the first voltage signal terminal VDD to the first node a, to control the voltage of the first node a (i.e., an end of the photosensitive diode D) to be Vdd (i.e., high level). Because the other end of the photosensitive diode D is coupled to the first voltage signal terminal, the voltages of both ends of the photosensitive diode D are equal to Vdd, and the photosensitive diode D is in the zero bias state. In addition, the fourth transistor T4 is turned on, and the first node a is coupled to the second node b, such that the voltage of the first node a is equal to the voltage of the second node b, i.e., the voltage of the second node b is also equal to Vdd (i.e., high level). Charges in the capacitor Cs are emptied because the voltages at both ends of the capacitor Cs are equal.

In the second phase S2, i.e., in a charging phase, the input signal from the signal input terminal VIN, the reset signal from the signal reset terminal VRST, and the read signal from the read control terminal VRL are low level signals.

As shown in FIG. 6B, the photosensitive diode D is irradiated by light, and the photosensitive diode D senses an optical signal and converts the sensed optical signal into a photocurrent. The photocurrent flows to the first node a, such that the voltage of the first node a rises slightly. In some embodiments of the present disclosure, both the first transistor T1 and the second transistor T2 operate in a saturation region, and the first transistor T1 and the second transistor T2 constitute the amplification circuit. The slight rising of voltage of the first node a causes increase of transconductance of the second transistor T2, such that the voltage of the second node b drops sharply. The voltage of the first node a is pulled back to Vdd due to a bootstrapping effect of the capacitor Cs. Because the above process occurs instantaneously, when a photoelectric conversion occurs in the photosensitive diode D, the voltage difference across the photosensitive diode D always remain the same, i.e., the photosensitive diode D remains in the zero bias state. Therefore, the photocurrent may not flow into the second transistor T2. Accordingly, the photocurrent may charge the capacitor Cs, and the capacitor Cs controls the voltage of the second node b by storing charges. The voltage output from the second node b satisfies Vout=Vdd+Idata*t, wherein Vdd represents the voltage of the first voltage signal terminal VDD, Idata represents the current value of the photocurrent, and t represents the time when the photosensitive diode D is irradiated by light.

In the third phase S3, i.e., in a read phase, both the input signal from the signal input terminal VIN and the reset signal from the signal reset terminal VRST are low level signals, and the read signal from the read control terminal VRL is a high level signal.

As shown in FIG. 6C, the fifth transistor T5 is turned on to provide the voltage of the second node b to the output line $L_{out}$. In some embodiments of the present disclosure, the read phase is instantaneous.

According to some embodiments of the present disclosure, the light intensity detecting device ensures that, in the reset phase and the charging phase, the photosensitive diode maintains equal voltages at both ends, and the photosensitive diode maintains in the zero bias state, and thus dark current in the photosensitive diode can be eliminated. Therefore, a signal outputted in the output phase is not interfered by the noise caused by the dark current, and thus the accuracy of light intensity detection is improved.

Figure 7:
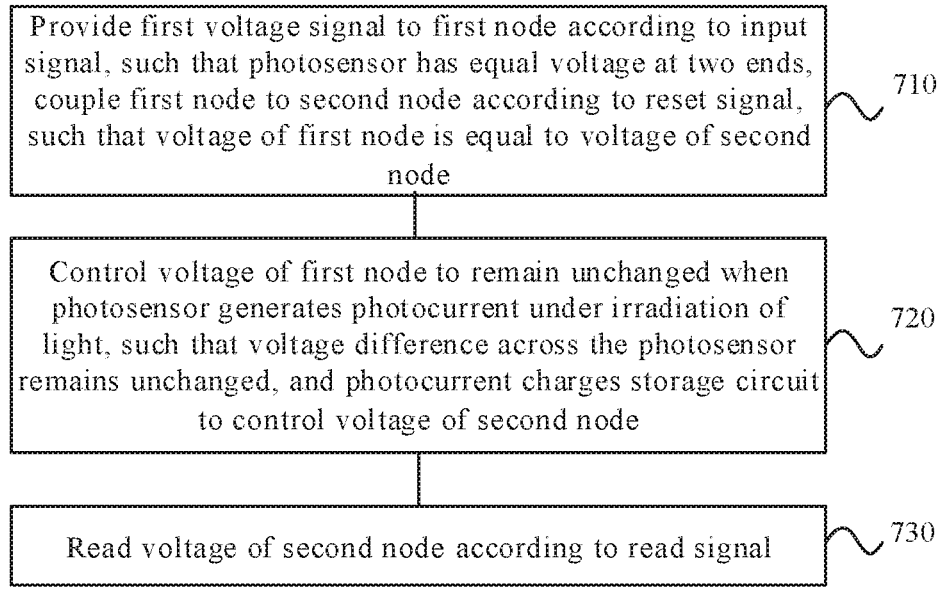
FIG. 7 illustrates a schematic flowchart of a method for detecting a light intensity according to an embodiment of the present disclosure.

FIG. 7 illustrates a schematic flowchart of a method for detecting a light intensity according to an embodiment of the present disclosure. For example, the method can implemented by the light intensity detecting device 100 as shown in FIG. 2 or the light intensity detecting device 200 as shown in FIG. 3. Steps of the method are described in details below.

In Step 710, the input circuit 120 may provide, to the first node a, a first voltage signal from the first voltage signal terminal VDD according to an input signal from the signal input terminal VIN, such that the voltages of both ends of the photosensor 110 are equal, i.e., the photosensor 110 is in a zero bias state. The feedback circuit 140 may couple the first node a to the second node b according to a reset signal from the signal reset terminal VRST, such that the voltage of the second node b is equal to the voltage of the first node a, i.e., equal to the voltage at the first voltage signal terminal. The voltage of the first node a is equal to the voltage of the second node b, and thus no charge is stored in the storage circuit 150.

In Step 720, when the photosensor 110 generates a photocurrent under irradiation of light, the voltage of the first node a is controlled to remain unchanged, such that the voltage difference across the photosensor remains unchanged, and the storage circuit 150 is charged via the photocurrent to control the voltage of the second node b. In some embodiments of the present disclosure, the amplification circuit 130 may control the voltage of the second node b according to the voltage of the first node a, and then the storage circuit 150 may control the voltage of the first node a to remain unchanged according to the voltage of the second node b.

In an embodiment, the photocurrent generated by the photosensor 110 flows to the first node a, such that the voltage of the first node a increases. The amplification circuit 130 may control the voltage of the second node according to the voltage of the first node a. For example, the amplification circuit 130 may provide a second voltage signal from the second voltage signal terminal VSS to the second node to reduce the voltage of the second node. The storage circuit 150 pulls down the voltage of the first node a back to the voltage of the first voltage signal terminal. In this way, the voltages at both ends of the photosensor 110 remain unchanged, i.e., the photosensor 110 is held in a zero bias state, and no dark current is present in the photosensor 110. Furthermore, the photocurrent flows to the storage circuit 150 to charge the storage circuit 150, thereby controlling the voltage of the second node b.

In Step 730, the output circuit 160 reads the voltage of the second node b according to a read signal from the read control terminal. The read voltage of the second node b satisfies Vout=Vdd+Idata*t, wherein Vdd represents the voltage of the first voltage signal terminal VDD, Idata represents the current value of the photocurrent, and t represents the time when the photosensor is irradiated by light.

According to the method for detecting a light intensity provided by some embodiments of the present disclosure, the photosensor remains equal voltages at both ends in the process of photoelectric conversion of the photosensor, thereby ensuring that the photosensor in the zero bias state, and no dark current is present in the photosensor. Thus, noise generated by the dark current in the photosensor may be avoided, and accuracy of light intensity detection may be improved.

Figure 8:
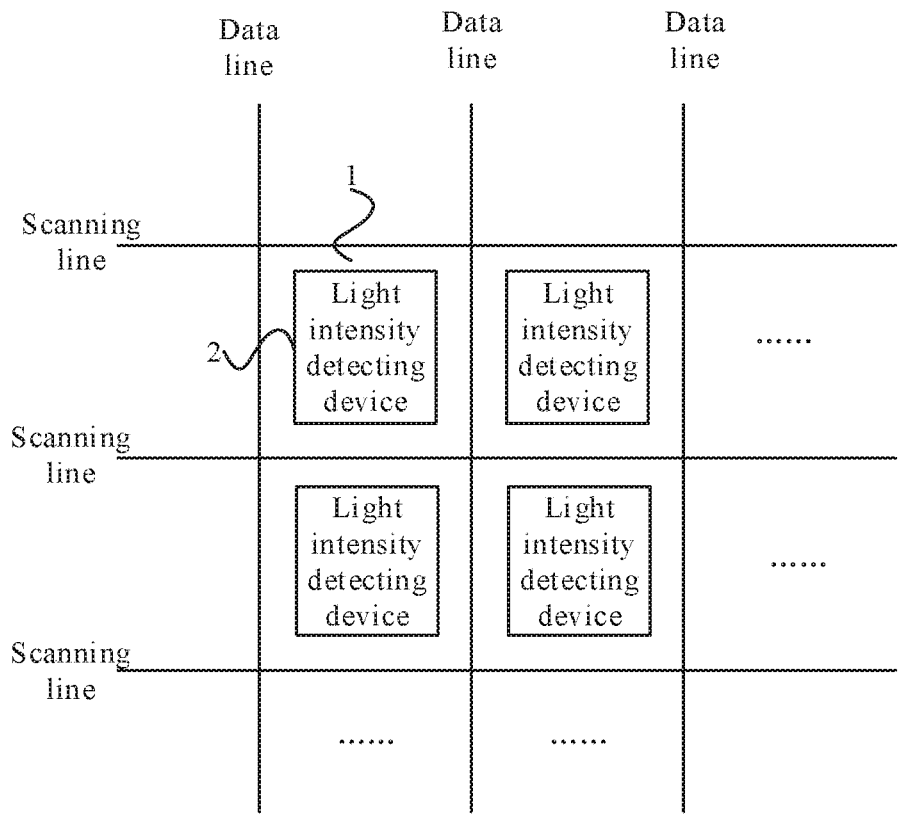
FIG. 8 illustrates a schematic structural diagram of a display device according to an embodiment of the present disclosure.

FIG. 8 illustrates a schematic structural diagram of a display device according to an embodiment of the present disclosure. As shown in FIG. 8, the display device may include scanning lines and data lines intersected with each other and a pixel region 1 defined by the scanning lines and the data lines. At least one pixel region 1 includes a light intensity detecting device 2. The light intensity detecting device 2 may be the light intensity detecting device 100 as shown in FIG. 2 or the light intensity detecting device 200 as shown in FIG. 3.

In some embodiments of the present disclosure, the light intensity detecting device 2 may be arranged in an array form, and the light intensity detecting device in the same row or the same column is coupled to the same output line.

In some embodiments of the present disclosure, the display device may include a display panel and a shell covering a non-display region of the display panel. The display device may be any product or component having a display function, such as a liquid crystal display (LCD) panel, an electronic paper display, an organic light-emitting diode (OLED) panel, a mobile phone, a tablet computer, a TV set, a display, a notebook computer, a digital photo frame, a navigation device, and the like, which are not limited by some embodiments of the present disclosure.

A plurality of embodiments of the present disclosure are described in detail above. However, the scope of protection of the present disclosure is not limited thereto. Apparently, those of ordinary skill in the art may make various modifications, substitutions, and variations on the embodiments of the present disclosure without departing from the spirit and scope of the present disclosure. The scope of protection of the present disclosure is limited by the appended claims.

What is claimed is:

1. A device for detecting a light intensity, the device comprising a photosensor, an input circuit, an amplification circuit, a feedback circuit, a storage circuit, and an output circuit;
   wherein the photosensor is coupled to a first voltage signal terminal and a first node;
   wherein the input circuit is configured to provide, to the first node, a first voltage signal from the first voltage signal terminal under control of an input signal from a signal input terminal;
   wherein the amplification circuit is configured to provide, to a second node, a second voltage signal from a second voltage signal terminal under control of the voltage of the first node, and wherein the amplification circuit comprises:
      a first transistor, wherein a control electrode and a first electrode of the first transistor are connected to the first voltage signal terminal, and wherein a second electrode of the first transistor is connected to the second node; and
      a second transistor, wherein a control electrode of the second transistor is connected to the first node, wherein a first electrode of the second transistor is connected to the second node, and wherein a second electrode of the second transistor is connected to the second voltage signal terminal;
   wherein the feedback circuit is configured to couple the first node to the second node under control of a reset signal from a signal reset terminal;
   wherein the storage circuit is configured to store a voltage difference between the first node and the second node, to control the voltage of the first node and the voltage of the second node; and
   wherein the output circuit is configured to read the voltage of the second node under control of a read signal from a read control terminal.

2. The device for detecting a light intensity according to claim 1, wherein the input circuit comprises:
   a third transistor, wherein a control electrode of the third transistor is coupled to the signal input terminal, wherein a first electrode of the third transistor is coupled to the first node, and wherein a second electrode of the third transistor is coupled to the first voltage signal terminal.

3. The device for detecting a light intensity according to claim 1, wherein the feedback circuit comprises:
   a fourth transistor, wherein a control electrode of the fourth transistor is coupled to the signal reset terminal, wherein a first electrode of the fourth transistor is coupled to the first node, and wherein a second electrode of the fourth transistor is coupled to the second node.

4. The device for detecting a light intensity according to claim 1, wherein the storage circuit comprises:
   a capacitor, wherein an end of the capacitor is coupled to the first node, and wherein another end of the capacitor is coupled to the second node.

5. The device for detecting a light intensity according to claim 1, wherein the output circuit comprises:
   a fifth transistor, wherein a control electrode of the fifth transistor is coupled to the read control terminal, wherein a first electrode of the fifth transistor is coupled to the second node, and wherein a second electrode of the fifth transistor is coupled to an output line.

6. The device for detecting a light intensity according to claim 1, wherein the photosensor comprises a photosensitive diode.

7. The device for detecting a light intensity according to claim 1, wherein a size of the first transistor is equal to a size of the second transistor.

8. A device for detecting a light intensity comprising:
   a photosensitive diode, wherein the photosensitive diode is coupled to a first voltage signal terminal and a first node;
   a first transistor, wherein a control electrode and a first electrode of the first transistor is coupled to the first voltage signal terminal, and wherein a second electrode of the first transistor is coupled to the second node;
   a second transistor, wherein a control electrode of the second transistor is coupled to the first node, wherein a first electrode of the second transistor is coupled to the second node, and wherein a second electrode of the second transistor is coupled to the second voltage signal terminal;
   a third transistor, wherein a control electrode of the third transistor is coupled to the signal input terminal, wherein a first electrode of the third transistor is coupled to the first node, and wherein a second electrode of the third transistor is coupled to the first voltage signal terminal;
   a fourth transistor, wherein a control electrode of the fourth transistor is coupled to the signal reset terminal, wherein a first electrode of the fourth transistor is coupled to the first node, and wherein a second electrode of the fourth transistor is coupled to the second node;
   a capacitor, wherein an end of the capacitor is coupled to the first node, and wherein another end of the capacitor is coupled to the second node; and
   a fifth transistor, wherein a control electrode of the fifth transistor is coupled to the read control terminal, wherein a first electrode of the fifth transistor is coupled to the second node, and wherein a second electrode of the fifth transistor is coupled to an output line.

9. The device for detecting a light intensity according to claim 8, wherein the first transistor, the second transistor, the third transistor, the fourth transistor, and the fifth transistor are N-type transistors.

10. A method for detecting a light intensity by using the device for detecting a light intensity according to claim 1, the method comprising:
    providing a first voltage signal from a first voltage signal terminal to a first node under control of an input signal, wherein a photosensor having an equal voltage at two ends of the photosensor, and coupling the first node to a second node under control of a reset signal from a signal reset terminal, wherein a voltage of the first node is equal to a voltage of the second node;
    controlling the voltage of the first node to remain unchanged in the case that the photosensor generates a photocurrent under irradiation of light, wherein a voltage difference across the photosensor remains unchanged, and charging a storage circuit by the photocurrent to control the voltage of the second node; and
    reading the voltage of the second node under control of a read signal from a read control terminal.

11. The method according to claim 10, wherein controlling the voltage of the first node to remain unchanged comprises:

controlling the voltage of the second node according to the voltage of the first node, and controlling the voltage of the first node to remain unchanged via the storage circuit.

12. The method according to claim 10, wherein the read voltage of the second node is $V_{out}=V_{dd}+I_{data}*t$;

wherein $V_{dd}$ represents a voltage of the first voltage signal terminal, wherein Idata represents a current value of the photocurrent, and wherein t represents time when the photosensor is under the irradiation of the light.

13. A display device comprising scanning lines and data lines intersected with each other and a pixel region defined by the scanning lines and the data lines; and the device for detecting a light intensity in the pixel region according to claim 1.

14. The device according to claim 13, wherein the device for detecting a light intensity is arranged in an array form, and wherein the device for detecting a light intensity in a same row or a same column is coupled to a same output line.

15. The method according to claim 11, wherein the read voltage of the second node is $V_{out}=V_{dd}+I_{data}*t$, and wherein $V_{dd}$ represents a voltage of the first voltage signal terminal, wherein Idata represents a current value of the photocurrent, and wherein t represents time when the photosensor is under the irradiation of the light.

16. The display device according to claim 13, wherein the amplification circuit comprises:

a first transistor, wherein a control electrode and a first electrode of the first transistor are coupled to the first voltage signal terminal, and wherein a second electrode of the first transistor is coupled to the second node; and a second transistor, wherein a control electrode of the second transistor is coupled to the first node, wherein a first electrode of the second transistor is coupled to the second node, and wherein a second electrode of the second transistor is coupled to the second voltage signal terminal.

17. The display device according to claim 13, wherein the input circuit comprises:

a third transistor, wherein a control electrode of the third transistor is coupled to the signal input terminal, wherein a first electrode of the third transistor is coupled to the first node, and wherein a second electrode of the third transistor is coupled to the first voltage signal terminal.

18. The display device according to claim 13, wherein the feedback circuit comprises:

a fourth transistor, wherein a control electrode of the fourth transistor is coupled to the signal reset terminal, wherein a first electrode of the fourth transistor is coupled to the first node, and wherein a second electrode of the fourth transistor is coupled to the second node.

19. The display device according to claim 13, wherein the storage circuit comprises:

a capacitor, wherein an end of the capacitor is coupled to the first node, and wherein another end of the capacitor is coupled to the second node.

* * * * *